(12) United States Patent  
Abe et al.

(10) Patent No.: US 6,323,169 B1
(45) Date of Patent: Nov. 27, 2001

(54) RESIST STRIPPING COMPOSITION AND PROCESS FOR STRIPPING RESIST

(75) Inventors: Kojiro Abe; Hideki Fukuda; Hisaki Abe; Taketo Maruyama, all of Niigata-ken (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 0 days.

(21) Appl. No.: 09/517,592

(22) Filed: Mar. 3, 2000

(30) Foreign Application Priority Data

Mar. 8, 1999 (JP) .................................................. 11-060219

(51) Int. Cl.⁷ ............................... C11D 3/04; C11D 3/30; C11D 3/36; C11D 3/39
(52) U.S. Cl. ......................... 510/176; 510/175; 510/245; 510/255; 510/257; 510/264; 510/499
(58) Field of Search .................................... 510/175, 176, 510/245, 255, 257, 264, 499; 134/1.3, 41, 39

(56) References Cited

U.S. PATENT DOCUMENTS

| | | | |
|---|---|---|---|
| 3,841,905 | * 10/1974 | Dixon, III | 117/212 |
| 5,466,389 | * 11/1995 | Ilardi et al. | 252/156 |
| 5,700,383 | 12/1997 | Feller et al. | 216/88 |
| 5,795,702 | 8/1998 | Tanabe et al. | 430/331 |
| 5,858,106 | 1/1999 | Ohmi et al. | 134/1 |
| 6,143,705 | * 11/2000 | Kakizawa et al. | 510/175 |

FOREIGN PATENT DOCUMENTS

| | | |
|---|---|---|
| 2 141 235 | 3/1973 | (DE) . |
| 62-49355 | 3/1987 | (JP) . |
| 64-42653 | 2/1989 | (JP) . |
| 7-201794 | 8/1995 | (JP) . |
| 8-202052 | 8/1996 | (JP) . |
| WO 97 36209 A | 10/1997 | (WO) . |

OTHER PUBLICATIONS

Patent Abstracts of Japan, Publication No. 01272785, Oct. 31, 1989.
Patent Abstracts of Japan, Publication No. 11340182, Dec. 10, 1999.
Database WPI, Section CH, Week 199148, Derwent Publications Ltd., Class E11, AN 1991–351231, XP002160604 & JP 03 237007 A Oct. 22, 1991.

* cited by examiner

*Primary Examiner*—Gregory Delcotto
(74) *Attorney, Agent, or Firm*—Antonelli, Terry, Stout & Kraus, LLP

(57) ABSTRACT

An aqueous resist stripping composition contains (a) an oxidizing agent, (b) a chelating agent, (c) a water-soluble fluorine compound, and optionally (d) an organic solvent. Also provided is a process of stripping resist films and resist residues remaining after etching treatment utilizing the aqueous resist stripping composition. In the process, corrosion of semiconductor materials, circuit-forming materials, insulating films, etc. is minimized and the rinsing is sufficiently made with only water without needing organic solvent such as alcohol.

16 Claims, 1 Drawing Sheet

RESIST STRIPPING COMPOSITION AND PROCESS FOR STRIPPING RESIST

BACKGROUND OF THE INVENTION

The present invention relates to a photoresist stripping composition and a process for stripping photoresist using the photoresist stripping composition, and more particularly, to a stripping composition for removing resist films and a process for stripping the resist films in the production of semiconductor integrated circuits and liquid crystal displays.

Photolithography has been generally employed for the production of semiconductor devices such as IC and LSI. The production of semiconductor devices by photolithography includes sequential steps of forming an insulating film such as a silicon oxide film or a conductive thin film such as a metal film for circuit wirings usually on a substrate such as silicon wafer; uniformly applying a photoresist composition on the film to form a photosensitive layer; forming desired resist patterns by selective exposure of the photosensitive layer to light and development; selectively etching the underlying thin film using the resist pattern as a mask; and then completely removing the resist pattern.

The recent demand for semiconductor devices more integrated than before requires patterns of quarter micron or smaller order. With such an extreme decrease in the processing dimension, the selective etching comes to be made mainly by a dry etching and the patterned resist comes to be removed by an oxygen-plasma asking.

However, it is well known that the dry etching process produces residues resulted from a dry-etching gas, a photoresist and an electrically conductive thin film in the periphery of the patterns. The residues will be hereinafter referred to as "resist residues." The resist residues, particularly those remaining in or around via holes, cause problems such as increase in the electrical resistance and occurrence of electrical short circuit. Therefore, it is very important for the production of semiconductor devices with high quality to remove the resist residues.

Japanese Patent Application Laid-Open Nos. 62-49355 and 64-42653 teach to remove the resist residues by organic amine stripping solutions comprising a mixture of an alkanolamine and an organic solvent. However, since the proposed stripping solutions are used at relatively high temperatures, inflammable organic compounds in the stripping solution are vaporized to likely cause bursting into flame. When a substrate cleansed with the organic amine stripping solution is rinsed with water without using an organic solvent such as alcohol, the metal film on the substrate is corroded by the alkaline nature of the remaining organic amine. Therefore, the rinsing requires the use of an organic solvent such as alcohol. To solve such problems, Japanese Patent Application Laid-Open Nos. 7-201794 and 8-20205 disclose fluorine-based aqueous solutions containing fluorine compound, organic solvent and anticorrosion agent. It is taught that the solutions have higher capability of removing the resist residues as compared with the organic amine stripping solutions, and are usable at lower temperatures.

Recent strict conditions for dry etching and asking in the production of semiconductor devices and substrates for liquid crystal display panels produce resist residues modified more complicatedly which are no longer removed completely by the above organic amine stripping solutions and fluorine-based aqueous solution. Resist residues remaining without removed cause several electrical troubles such as increase in electrical resistance, discontinuation of conductive lines, occurrence of electrical short circuits and improperly configured circuits. Therefore, a cleaning agent capable of completely removing such resist residues is strongly required.

Accordingly, it is an object of the present invention to provide a resist stripping composition which removes in a short period of time patterned resist films and resist residues remaining on an inorganic substrate after dry etching in a circuit-forming process of semiconductor devices for use in semiconductor integrated circuits or liquid crystal displays, and which causes no corrosion against various circuit materials or insulating materials. It is also an object of the present invention to provide a resist stripping process using the resist stripping composition.

SUMMARY OF THE INVENTION

As a result of extensive studies in view of the above objects, the inventors have found that an aqueous resist stripping composition comprising (a) an oxidizing agent, (b) a chelating agent and (c) a water-soluble fluorine compound easily removes in a short period of time resist residues and patterned resist films remaining on an inorganic substrate after dry etching, or resist residues remaining after asking subsequent to the dry etching. It has em been further found that the resist stripping composition enables the superfine circuit processing without corroding circuit-forming materials or insulating films, and requires no organic solvent such as alcohol as a rinsing solution, i.e., allows semiconductor devices to be rinsed with water alone, thereby ensuring the production of high precision circuits.

Thus, in a first aspect of the present invention, there is provided an aqueous resist stripping composition comprising (a) an oxidizing agent, (b) a chelating agent and (c) a water-soluble fluorine compound.

In a second aspect of the present invention, there is provided an aqueous resist stripping composition comprising (a) an oxidizing agent, (b) a chelating agent, (c) a water-soluble fluorine compound and (d) an organic solvent.

In a third aspect of the present invention, there is provided a process for stripping resist using the stripping composition.

DETAILED DESCRIPTION OF THE INVENTION

Figure 1:
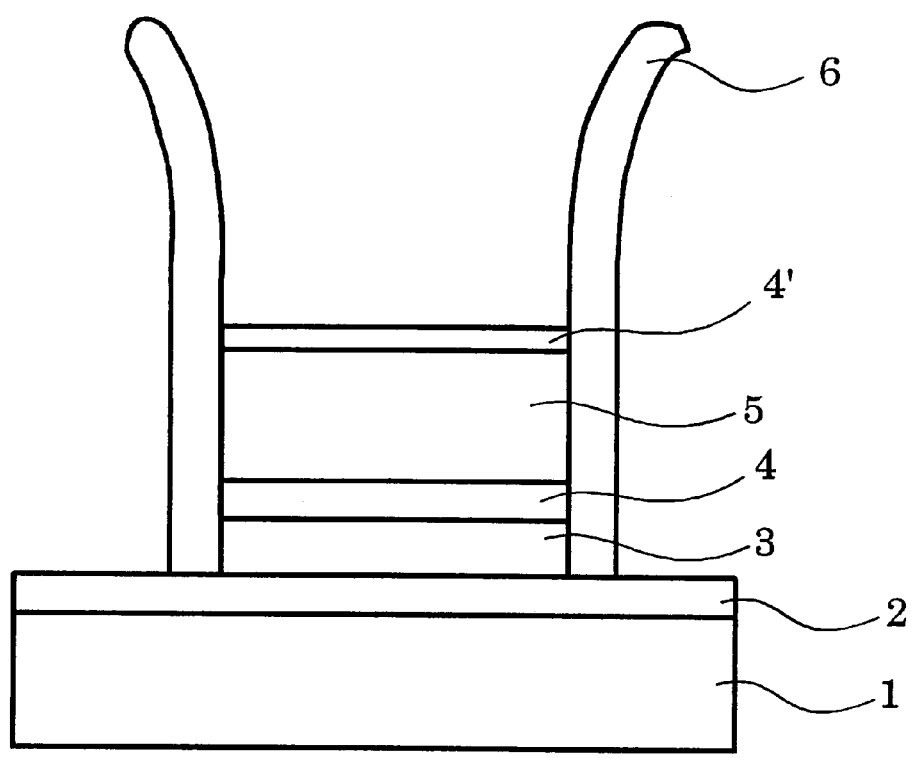
FIG. 1 is a schematic cross-sectional view showing a circuit device after oxygen-plasma asking subsequent to dry etching using a patterned resist films as a mask.

The oxidizing agent (a) usable in the present invention may include inorganic oxides such as hydrogen peroxide, ozone, hypochlorous acid, etc., and preferably hydrogen peroxide. The concentration of the oxidizing agent in the resist stripping composition is 0.0001 to 60% by weight, preferably 0.0005 to 30% by weight.

The chelating agent (b) usable in the present invention may be an aminopolycarboxyhic acid and its salt such as ammonium salt, metal salt and organic alkali salt. The aminopolycarboxyhic acid may include hi ethylenediaminetetraacetic acid (EDTA), dihydroxyethylethylenediaminetetraacetic acid (DHEDTA), 1,3-propanediaminetetraacetic acid (1,3-PDTA), diethylenetriaminepentaacetic acid (DTPA), triethylenetetraminehexaacetic acid (TTNA), nitrflotriacetic acid (NTA) and hydroxyethyhiminodiacetic acid (HIMDA).

Another chelating agent may be a phosphonic chelating agent having at least one phosphonic acid group in one molecule, its oxidized derivative and its salt such as ammonium salt, organic amine salt and alkali metal salt. The phosphonic chelating agent may include methyldiphosphonic acid, aminotrismethylenephosphonic acid, ethylidenediphosphonic acid, 1-hydroxyethylidene-1,1-diphosphonic acid, 1-hydroxypropyhidene-1,1-diphosphonic acid, ethylaminobismethylenephosphonic acid, dodecylaminobismethylenephosphonic acid, nitrilotrismethylenephosphonic acid, ethylenediaminebismethylenephosphonic acid, ethylenediaminetetrakismethylenephosphonic acid, hexanediaminetetrakismethylenephosphonic acid, diethylenetriaminepentamethylenephosphonic acid and 1,2-propanediaminetetramethylenephosphonic acid. Nitrogen atom in a phosphonic chelating agent molecule may be oxidized to form the N-oxide derivative.

Still further usable as the chelating agent is a condensed phosphoric acid such as metaphosphoric acid, tetrametaphosphric acid, hexametaphosphoric acid and tripolyphosphoric acid, and its salt such as ammonium salt, metal salt and organic amine salt.

Of the above chelating agents, those having at least two phosphonic acid groups in one molecule are preferable, and those having 2 to 6 phosphonic acid groups are more preferable. Specifically, 1,2-propanediaminetetramethylenephosphonic acid, diethylentriaminepentamethylenephosphonc acid and ethylenediaminetetrakismethylenephosphonic acid are preferable, and particularly preferred is 1,2-propanediaminetetramethylenephosphonic acid.

The above chelating agents may be used alone or in combination of two or more.

The concentration of the chelating agent preferably 0.01 to 5% by weight, more preferably 0.05 to 3% by weight based on the total weight of the stripping composition.

The water-soluble fluorine compounds (c) usable in the present invention may include organic amine fluorides such as ammonium fluoride, acid ammonium fluoride and monoethanolamine fluoride, and tetramethyl ammonium fluoride. The concentration of the water-soluble fluorine compound is preferably 0.001 to 10% by weight, more preferably 0.005 to 5% by weight based on the total weight of the stripping composition.

The organic solvents (d) usable in the present invention may include ether solvents such as ethylene glycol monoethyl ether, ethylene glycol monobutyl ether, diethylene glycol monomethyl ether, diethylene glycol monoethyl ether, diethylene glycol monobutyl ether, propylene glycol monomethyl ether, propylene glycol monoethyl ether, propylene glycol monobutyl ether, dipropylene glycol monomethyl ether, dipropylene glycol monoethyl ether, dipropylene glycol monobutyl ether, diethylene glycol dimethyl ether and dipropylene glycol dimethyl ether; amide solvents such as formamide, monomethylformamide, dimethylformamide, monoethylformamide, diethylformamide, acetamide, monoethylacetamide, dimethylacetamide, monoethylacetamide, diethylacetamide, N-methylpyrrolidone and N-ethylpyrrolidone; and sulfur compound solvents such as dimethyl sulfoxide, dimethyl sulfone, diethyl sulfone, bis(2-hydroxy) sulfone and tetramethylene sulfone. Preferred are dimethyl sulfoxide, N,N-dimethylforamide, N,N-dimethylacetamide, N-methylpyrrohidone, diethylene glycol monomethyl ether, diethylene glycol monobutyl ether, dipropylene glycol monomethyl ether and dipropylene glycol monobutyl ether.

The organic solvents may be used alone or in combination of two or more. The concentration of the organic solvent is selected from the range of 1 to 7% by weight based on the total weight of the stripping composition. Whether or not the organic solvent is to be used and the concentration thereof may be easily determined depending upon dry-etching and/or asking conditions and other factors familiar to one skilled in the art.

The stripping composition according to the present invention is an aqueous composition containing the components (a) to (c), the optional component (d), and the balance being water. The stripping composition may be dispersion or suspension, and usually aqueous solution. The resist stripping solution may contain additives used in conventional resist stripping solutions, unless the objects of the present invention are adversely affected by the addition thereof.

The pH of the stripping composition is not particularly restricted, and may be usually selected from the range of pH 3 to pH 12 depending upon etching conditions, materials for the inorganic substrate, etc. When alkaline stripping composition is intended, ammonia, amine or quaternary ammonium hydroxides such as tetramethylammonium hydroxide may be added, and when acidic stripping composition is intended, organic acid or inorganic acid may be added.

In order to improve a wettability of the stripping composition, any of cationic, nonionic and anionic surfactants may be used.

The resist stripping composition of the present invention may be produced by any of methods known in the art. For example, the components (a) to (c) and the optional component (d) are added to water under stirring until the mixture reaches homogeneous state. The order of adding the components is not critical.

The stripping process according to the present invention is usually carried out at a temperature from ordinary temperature to 80° C., and the specific stripping temperature may be appropriately selected depending upon etching conditions and materials for inorganic substrate used.

Materials for the inorganic substrates may be semiconductive circuit-forming materials such as silicon, amorphous silicon, polysilicon, silicon oxide film, silicon nitride film, aluminum, aluminum alloys, copper, copper alloys, titanium, titanium-tungsten, titanium nitride, tungsten, tantalum, tantalum compounds, tantalum alloys, chromium, chromium oxide, chromium alloys and ITO (indium-tin oxide); compound semiconductors such as gallium-arsenic, gallium-phosphorus and indium-phosphorus; and glass substrates for LCD.

The stripping process of the present invention is used to remove resist films coated onto the inorganic substrate, patterned resist films remaining after etching, or resist residues remaining after asking subsequent to the etching. In the stripping process, the resist films and/or resist residues are brought into contact with the resist stripping composition by immersion, dipping, etc. Heating, ultrasonic exposure or the like may be appropriately used in combination, if required.

"Asking" referred to herein is a resist removal method in which, for example, a resist made of organic polymer is vaporized to CO and $CO_2$ by combustion in oxygen plasma. Specifically, a substrate being treated and an asking gas are sealed in a chamber placed between a pair of electrodes. Upon applying high-frequency voltage to the electrodes, plasma of the asking gas is generated in the chamber. By the reaction between activated ions in the plasma and the substance on the substrate surface, the photoresist is vaporized.

The rinsing after the treatment by the resist stripping composition of the present invention may be done using water alone, and no organic solvent such as alcohol is required.

The present invention will be described in more detail by examples and comparative examples. However, it should be noted that the following examples are illustrative and not intended to limit the invention thereto.

EXAMPLE 1 to 10 and Comparative Examples 1 to 8

FIG. 1 is a cross sectional view showing an Al alloy circuit device after subjected to dry etching for forming Al alloy (Al—Cu) circuit pattern 5 and subsequently oxygen plasma asking. In FIG. 1, an oxide film 2 was formed on a silicon substrate 1, and an Al alloy circuit pattern 5 was formed thereon via titanium film 3 and titanium nitride film 4 as barrier metal films. On the Al alloy circuit pattern 5, another titanium nitride film 4' was disposed. Resist residue 6 remained on side walls of stacked films.

More specifically, FIG. 1 is a cross sectional view showing the Al alloy circuit device after oxygen plasma asking. It was obtained by disposing the Al alloy (Al—Cu) film for circuit pattern on the silicon substrate. On the Al alloy film, a resist composition was coated to form a resist film, which was then patterned by photolithography. Then dry etching with a fluorine-based gas was carried out using the patterned resist film as a mask to make the Al alloy film to circuit pattern, followed by oxygen plasma ashing. In FIG. 1, the resist residues remained on side walls of the Al alloy circuit pattern.

The Al alloy circuit device was immersed in a resist stripping composition having chemical composition as shown in Table 1 under respective conditions, rinsed with ultrapure water and then dried. Then, the surface of the circuit device was observed under scanning electron microscope (SEM) to evaluate the removal of the resist residues and the corrosion of the Al alloy according to the following ratings. The results are shown in Table 1.

Ratings for SEM Observation

Removal
  ++: Completely removed
  +: Almost completely removed
  −: Partially remained
  −−: Most remained Corrosion
  ++: No corrosion
  +: Almost no corrosion
  −: Crater or pit by corrosion
  −−: Roughened whole surface and loss of Al alloy film

TABLE 1

| | Resist Stripping Composition | | | | | Stripping Conditions | | Removal of | |
|---|---|---|---|---|---|---|---|---|---|
| | Oxidizing agent (wt. %) | Chelating agent (wt. %) | Fluorine compound (wt. %) | Organic solvent (wt. %) | Water | Temperature (° C.) | Time (min.) | resist residues | Corrosion of Al alloy |
| Examples | | | | | | | | | |
| 1 | HP (5) | C1 (0.2) | AF (0.05) | — | balance | 23 | 5 | ++ | ++ |
| 2 | HP (2) | C1 (0.5) | AF (0.1) | — | balance | 23 | 5 | ++ | ++ |
| 3 | HP (1) | C1 (0.1) | AF (0.5) | — | balance | 23 | 5 | ++ | ++ |
| 4 | HP (5) | C2 (0.2) | AF (0.1) | — | balance | 23 | 5 | ++ | ++ |
| 5 | HP (5) | C3 (0.2) | AF (0.1) | — | balance | 23 | 5 | ++ | ++ |
| 6 | HP (5) | C4 (0.2) | AF (0.1) | — | balance | 23 | 5 | ++ | ++ |
| 7 | HP (0.5) | C1 (0.2) | AF (0.01) | — | balance | 40 | 5 | ++ | ++ |
| 8 | HP (7) | C1 (0.2) | AF (0.8) | S1 (45) | balance | 23 | 3 | ++ | ++ |
| 9 | HP (7) | C5 (0.3) | AF (0.8) | S2 (45) | balance | 23 | 3 | ++ | ++ |
| 10 | HP (7) | C6 (0.3) | AF (0.8) | S2 (50) | balance | 23 | 5 | ++ | ++ |
| Comparative Examples | | | | | | | | | |
| 1 | HP (5) | — | — | — | balance | 23 | 5 | −− | ++ |
| 2 | — | C1 (0.5) | — | balance | 23 | 5 | −− | ++ | |
| 3 | — | — | AF (0.5) | — | balance | 23 | 5 | − | + |
| 4 | — | — | — | S1 (40) | balance | 23 | 5 | −− | ++ |
| 5 | HP (5) | C1 (0.2) | — | — | balance | 23 | 5 | ` | ++ |
| 6 | HP (5) | — | AF (0.1) | — | balance | 23 | 5 | + | − |
| 7 | — | — | AF (0.5) | S1 (45) | balance | 23 | 5 | − | + |
| 8 | — | C1 (0.2) | AF (0.5) | S1 (45) | balance | 23 | 5 | + | + |

HP: Hydrogen peroxide
C1: 1,2-Propanediaminetetramethylenephosphonic acid
C2: Diethylenetriaminepentamethylenephosphonic acid
C3: Ethylenediaminetetrakismethylenephosphonic acid
C4: Ethylenediamine tetraacetic acid
C5: 1-Hydroxyethylidene-1,1-diphosphonic acid
C6: Phosphoric acid
AF: Ammonium fluoride
S1: Dimethylacetamide
S2: Dimethylformamide

EXAMPLE 11

In the same manner as in Example 1, an Al alloy (Al—Cu) film was formed on a silicon substrate and coated with a resist film, which was subjected to photolithography to form a patterned resist film. Then the Al alloy film was dry-etched with a fluorine-based gas using the patterned resist film as a mask. The circuit device thus obtained was immersed in the same photoresist stripping composition as used in Example 1 at 50° C. for 5 minutes to remove the patterned resist film used as a mask and resist residues generated during the dry-etching, rinsed with ultra-pure water, and then dried. Thereafter, the surface of the circuit device was observed under scanning electron microscope (SEM) to evaluate the removal of the patterned resist film and resist residues and the corrosion of the Al alloy according to the ratings mentioned above. As a result, it was confirmed that the patterned resist film and resist residues were completely removed with no corrosion of the Al alloy circuit pattern.

By using the resist stripping composition according to the present invention, a resist film coated on an inorganic substrate, a patterned resist film remaining after etching, or resist residues remaining after asking subsequent to the etching are easily removed at lower temperatures for a short period of time. With such a stripping treatment, since the underlying circuit-forming material is not corroded, finely processed circuit pattern is obtained. In addition, the rinse of the circuit device after stripping treatment is sufficiently done with only water, and the use of organic solvent such as alcohol is not required, resulting in the production of circuit patterns with a high accuracy and a high quality.

What is claimed is:

1. An aqueous resist stripping composition containing (a) 0.0001 to 60% by weight of an oxidizing agent, (b) 0.01 to 5% by weight of a chelating agent which is at least one compound selected from the group consisting of aminopolycarboxylic acids, ammonium salts of the aminopolycarboxylic acids, metal salts of the aminopolycarboxylic acids, organic alkali salts of the aminopolycarboxylic acids, phosphonic chelating agents, ammonium salts of the phosphonic chelating agents, organic amine salts of the phosphonic chelating agents, alkali metal salts of the acids, ammonium salts of the condensed phosphoric acids, metal salts of the condensed phosphoric acids, and organic amine salts of the condensed phosphoric acids and (c) 0.001 to 10% by weight of a water-soluble fluorine compound which is at least one compound selected from the group consisting of ammonium fluoride, acid ammonium fluoride, monoethanolamine fluoride, and tetramethylammonium fluoride, the balance being water.

2. The aqueous resist stripping composition according to claim 1, further containing (d) an organic solvent.

3. The aqueous resist stripping composition according to claim 1, wherein said oxidizing agent is at least one oxide selected from the group consisting of hydrogen peroxide, ozone and hypochlorous acid.

4. The aqueous resist stripping composition according to claim 1, wherein said oxidizing agent is hydrogen peroxide.

5. The aqueous resist stripping composition according to claim 1, wherein said chelating agent is an aminopolycarboxylic acid, and said aminopolycarboxylic acid is at least one compound selected from the group consisting of ethylenediamine tetraacetic acid, dihydroxyethylethylenediaminetetraacetic acid, 1,3-propanediaminetetraacetic acid, diethylenetriaminepentaacetic acid, triethylenetetraminehexaacetic acid, nitrilotriacetic acid and hydroxyethylimidiacetic acid.

6. The aqueous resist stripping composition according to claim 1, wherein said chelating agent is a phosphonic chelating agent, and said phosphonic chelating agent is at least one compound selected from the group consisting of methyldiphosphonic acid, aminotrismethylene-phosphonic acid, ethylidenediphosphonic acid, 1-hydroxyethylidene -1,1-diphosphonic acid, 1-hydroxypropylidene-1,1-diphosphonic acid, ethylaminobismethylenephosphonic acid, decylaminobismethylenephosphonic acid, nitrilotrismethylene-phosphonic acid, ethylenediaminebismethylenephosphonic acid, ethylenediaminetetrakismethylenephosphonic acid, hexanediaminetetrakismethylenephosphonic acid, diethylenetriamine-pentamethylenephosphonic acid and 1,2-propanediaminetetra-methylenephosphonic acid.

7. The aqueous resist stripping composition according to claim 1, wherein said chelating agent is a condensed phosphoric acid, and said condensed phosphoric acid is at least one compound selected from the group consisting of metaphosphoric acid, tetrametaphosphoric acid, hexametaphosphoric acid and tripolyphosphoric acid.

8. The aqueous resist stripping composition according to claim 1, wherein said chelating agent is a phosphonic chelating agent.

9. The aqueous resist stripping composition according to claim 8, wherein said phosphonic chelating agent has 2 to 6 phosphonic acid groups.

10. The aqueous resist stripping composition according to claim 8, wherein said phosphonic chelating agent is at least one compound selected from the group consisting of 1,2-propanediaminetetramethylenephosphonic acid, diethylenetriaminepentamethylenephosphonic acid and ethylenediaminetetrakismethylene phosphonic acid.

11. The aqueous resist stripping composition according to claim 1, wherein said water-soluble fluorine compound is ammonium fluoride.

12. The aqueous resist stripping composition according to claim 2, wherein said organic solvent is at least one solvent selected from the group consisting of ethylene glycol monoethyl ether, ethylene glycol monobutyl ether, diethylene glycol monomethyl ether, diethylene glycol monoethyl ether, diethylene glycol monobutyl ether, propylene glycol monomethyl ether, propylene glycol monoethyl ether, propylene glycol monobutyl ether, dipropylene glycol monomethyl ether, dipropylene glycol monoethyl ether, dipropylene glycol monobutyl ether, diethylene glycol dimethyl ether, dipropylene glycol dimethyl ether, formamide, monomethylformamide, dimethylformamide, monoethylformamide, diethylformamide, acetamide, monoethylacetamide, dimethylacetamide, monoethylacetamide, diethylacetamide, N-methylpyrrolidone, N-ethylpyrrolidone, dimethyl sulfoxide, dimethyl sulfone, diethyl sulfone, bis(2-hydroxy) sulfone and tetramethylene sulfone.

13. The aqueous resist stripping composition according to claim 2, wherein said organic solvent is at least one solvent selected from the group consisting of dimethyl sulfoxide, N,N-dimethylforamide, N,N-dimethylacetamide, N-methylpyrrolidone, diethylene glycol monomethyl ether, diethylene glycol monobutyl ether, dipropylene glycol monomethyl ether and dipropylene glycol monobutyl ether.

14. The aqueous resist stripping composition according to claim 2, comprising (a) 0.0001 to 60% by weight of said oxidizing agent, (b) 0.01 to 5% by weight of said chelating agent, (c) 0.001 to 10% by weight of said water-soluble fluorine compound, (d) 1 to 70% by weight of said organic solvent, and balance being water.

15. The aqueous resist stripping composition according to claim 1, wherein the oxidizing agent is hydrogen peroxide, the chelating agent is 1,2-propanediaminetetramethylenephosphonic acid, and the water-soluble fluorine compound is ammonium fluoride.

16. The aqueous resist stripping composition according to claim 5, wherein said oxidizing agent is at least one oxide selected from the group consisting of hydrogen peroxide, ozone and hypochlorous acid.

* * * * *